United States Patent
Yoshida et al.

(10) Patent No.: US 9,202,988 B2
(45) Date of Patent: Dec. 1, 2015

(54) NITRIDE SEMICONDUCTOR LIGHT-EMITTING ELEMENT

(71) Applicant: PANASONIC CORPORATION, Osaka (JP)

(72) Inventors: Shinji Yoshida, Shiga (JP); Atsunori Mochida, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/458,182

(22) Filed: Aug. 12, 2014

(65) Prior Publication Data

US 2014/0346557 A1    Nov. 27, 2014

Related U.S. Application Data

(63) Continuation of application No. PCT/JP2013/002053, filed on Mar. 26, 2013.

(30) Foreign Application Priority Data

Jun. 29, 2012 (JP) .................................. 2012-146326

(51) Int. Cl.
*H01L 33/44* (2010.01)
*H01S 5/028* (2006.01)
(Continued)

(52) U.S. Cl.
CPC ............... *H01L 33/44* (2013.01); *H01L 33/32* (2013.01); *H01S 5/0282* (2013.01); *H01S 5/34333* (2013.01); *H01S 5/02212* (2013.01)

(58) Field of Classification Search
CPC .............................. H01L 33/44; H01L 33/46
USPC ............... 257/16, 98, 99; 372/44.01, 44.011, 372/45.012
See application file for complete search history.

(56) References Cited

U.S. PATENT DOCUMENTS 8,571,083 B2 * 10/2013 Kawaguchi ............ B82Y 20/00
                                                              372/49.01
2006/0133442 A1    6/2006 Kondou et al.
(Continued)

FOREIGN PATENT DOCUMENTS

JP    2006-203162 A    8/2006
JP    2007-243023 A    9/2007
(Continued)

OTHER PUBLICATIONS

English Translation of JP 2011-009374 A, Provided by AIPN, Jan. 13, 2011.*
(Continued)

*Primary Examiner* — Cheung Lee
*Assistant Examiner* — Stephen Bradley
(74) *Attorney, Agent, or Firm* — McDermott Will & Emery LLP

(57) ABSTRACT

A nitride semiconductor light-emitting element includes a layered semiconductor body which is made of a group III nitride semiconductor, and includes a light-emitting facet, and a multilayer protective film which is formed to cover the light-emitting facet of the layered semiconductor body, and includes a plurality of insulating films. The multilayer protective film includes a first protective film and a second protective film covering the first protective film. The first protective film is a crystalline film which is made of nitride containing aluminum, and is at least partially crystallized. The second protective film is a crystalline film which is made of oxide containing aluminum, and is at least partially crystallized.

19 Claims, 12 Drawing Sheets

(51) Int. Cl.
    *H01L 33/32*     (2010.01)
    *H01S 5/343*     (2006.01)
    *H01S 5/022*     (2006.01)

(56) References Cited

U.S. PATENT DOCUMENTS

| | | |
|---|---|---|
| 2007/0205424 A1 | 9/2007 | Kamikawa et al. |
| 2007/0246720 A1 | 10/2007 | Kamikawa et al. |
| 2007/0246802 A1* | 10/2007 | Xianyu ............ H01L 21/02381 257/637 |
| 2008/0219313 A1 | 9/2008 | Yoshida |
| 2009/0026481 A1 | 1/2009 | Kamikawa et al. |
| 2009/0086783 A1 | 4/2009 | Kameyama et al. |
| 2010/0133582 A1 | 6/2010 | Mochida et al. |
| 2010/0159626 A1 | 6/2010 | Kondou et al. |
| 2011/0007770 A1 | 1/2011 | Kondou et al. |
| 2011/0057220 A1* | 3/2011 | Mochida et al. ............... 257/98 |
| 2012/0057612 A1* | 3/2012 | Yoshida et al. ............ 372/49.01 |
| 2012/0063483 A1* | 3/2012 | Kameyama et al. ....... 372/49.01 |
| 2012/0093186 A1* | 4/2012 | Murayama ................. 372/44.01 |

FOREIGN PATENT DOCUMENTS

| | | |
|---|---|---|
| JP | 2007-318088 A | 12/2007 |
| JP | 2008-103407 A | 5/2008 |
| JP | 2008-147363 A | 6/2008 |
| JP | 2009-099958 A | 5/2009 |
| JP | 2009-267108 A | 11/2009 |
| JP | 2010-135516 A | 6/2010 |
| JP | 2011-009374 A | 1/2011 |
| JP | 2011009374 A * | 1/2011 |
| JP | 2011-060932 A | 3/2011 |
| JP | 2011-119540 A | 6/2011 |
| JP | 2012-084753 A | 4/2012 |
| WO | 2010/134229 A1 | 11/2010 |

OTHER PUBLICATIONS

International Search Report issued in International Application No. PCT/JP2013/002053 with Date of mailing Jul. 2, 2013, with English Translation.

English translation of Office Action issued in Chinese Application No. 201380018174.4 dated Mar. 27, 2015.

* cited by examiner

NITRIDE SEMICONDUCTOR LIGHT-EMITTING ELEMENT

CROSS-REFERENCE TO RELATED APPLICATION

This is a continuation of International Application No. PCT/JP2013/002053 filed on Mar. 26, 2013, which claims priority to Japanese Patent Application No. 2012-146326 filed on Jun. 29, 2012. The entire disclosures of these applications are incorporated by reference herein.

BACKGROUND

The present disclosure relates to nitride semiconductor light-emitting elements, particularly to nitride semiconductor light-emitting elements including a protective film provided on a light-emitting facet.

Among semiconductor light-emitting devices, semiconductor laser devices have widely been used as a light source for reproducing and recording data of optical disc media such as compact discs (CD), digital versatile discs (DVD), Blu-ray™ discs, etc. In particular, the semiconductor laser devices have been required to record information at high speed, and higher output has been indispensable for the semiconductor laser devices to record more information in a short time. In recent years, high output semiconductor laser devices, which are inexpensive and stable solid light sources, have been required as light sources for displays, such as projectors, and light sources used for processing, such as laser annealing.

In general, when an optical output of the semiconductor laser device increases, the semiconductor laser device is deteriorated, e.g., an operating current gradually increases, or optical breakdown in which the semiconductor laser device stops oscillation occurs. Thus, researches and developments have been conducted to reduce or prevent the deterioration of the semiconductor laser device for higher output of the semiconductor laser device. In particular, a sudden death failure accompanied by the optical breakdown occurs at a front facet which is a light-emitting surface of a cavity constituting a semiconductor laser element, and efforts have been made to strengthen and stabilize a protective film covering the facet of the cavity. The facet of the cavity of the semiconductor laser element is usually covered with the protective film. The protective film controls a reflectance at the facet of the cavity, prevents adhesion of foreign matters on the facet, and prevents oxidation of the facet. FIG. 13 shows a schematic cross-section of a conventional nitride semiconductor laser element disclosed by Japanese Unexamined Patent Publication No. 2007-318088. As shown in FIG. 13, the conventional nitride semiconductor laser element includes a laser structure 400 including an active layer (a light-emitting layer), and an n-type semiconductor layer and a p-type semiconductor layer sandwiching the active layer. Although not shown, a p-side electrode is formed on the p-type semiconductor layer, and an n-side electrode is formed on the n-type semiconductor layer.

A protective film 406, which is a multilayer film of metal oxide such as silicon oxide ($SiO_2$), aluminum oxide ($Al_2O_3$), etc., is formed on a rear facet which functions as a mirror of a cavity of the laser structure 400. A first protective film 407 made of aluminum nitride (AlN) or aluminum oxynitride (AlON) is formed on a front facet of the cavity, and a second protective film 408 made of aluminum oxide ($Al_2O_3$) is formed on the first protective film 407.

A possible cause of the deterioration of the semiconductor laser element associated with the higher output is a solid phase reaction caused between the first protective film 407 etc. and facets of the semiconductor layers due to generation of heat and absorption of light by the laser structure 400. Another possible cause is an interface reaction at the facet of the cavity in which residual oxygen in each protective film or oxygen in a package is diffused in the protective films as laser oscillation occurs to oxidize the facet of the cavity.

As heat is generated in the laser oscillation, physical breakdown occurs, e.g., the protective films may peel off the laser structure 400, or the laser structure 400 may be cracked. An AlN film used as the first protective film 407 shown in FIG. 13, or an AlON film in which a composition ratio of oxygen is 0.2 or lower is a thin crystalline film, and is an excellent material as the protective film on the facet for its strength and high thermal conductivity. In particular, AlN is a nitride like the nitride semiconductor, and the solid phase reaction with the laser structure 400 can be reduced. However, it has been known that these materials show a light absorption band near 400 nm derived from crystal defects etc., and heat generation, diffusion of oxygen, and oxidation may be caused by the absorption of light in the laser oscillation.

Japanese Unexamined Patent Publication No. 2008-147363 discloses a protective film made of AlN to which a rare earth element is added to reduce the diffusion of oxygen. Addition of the rare earth element to AlN or AlON can reduce the diffusion of oxygen because the rare earth element and oxygen are bonded. With use of the AlN film added with the rare earth element, the oxidation of the facet of the cavity and peeling of the protective films can be prevented, the deterioration of the facet and the optical breakdown can be reduced, and therefore, laser operation can be performed for a long time as compared with the case where a normal AlN film is used.

SUMMARY

The AlN film or the AlON film added with the rare earth element such as yttrium (Y) etc. disclosed by Japanese Unexamined Patent Publication No. 2008-147363 accelerates oxidation by the effect of the rare earth element, and prevents oxygen from reaching the laser-oscillating facet of the semiconductor. However, the AlN film generates an aluminum oxynitride (AlON) film by oxidation, and a composition ratio of oxygen in the generated AlON film increases due to the oxidation. As a result, the AlN film or the AlON film may be peeled off the $Al_2O_3$ film due to variation in film stress and volume expansion. The deterioration in the protective film on the facet is a new cause of the sudden death failure of the semiconductor laser element.

The present disclosure is intended to solve the above-described problems, and to provide the protective film on the facet in which the deterioration is reduced, and the optical breakdown accompanied by the peeling of the film does not occur even in a high output operation.

In view of the foregoing, the present disclosure is directed to a configuration in which a crystalline film made of nitride containing aluminum, and a crystalline film made of oxide containing aluminum are used as a protective film on a light-emitting facet of a nitride semiconductor light-emitting element.

An exemplary embodiment of the disclosed nitride semiconductor light-emitting element includes a layered semiconductor body which is made of a group III nitride semiconductor, and includes a light-emitting facet, and a multilayer protective film which is formed to cover the light-emitting facet of the layered semiconductor body, and includes a plurality of insulating films. The multilayer protective film includes a first protective film and a second protective film covering the first protective film. The first protective film is a crystalline film which is made of nitride containing aluminum, and is at least partially crystallized. The second protective film is a crystalline film which is made of oxide containing aluminum, and is at least partially crystallized.

In the exemplary embodiment of the present disclosure, the crystalline film which is made of oxide containing aluminum, and is at least partially crystallized is used as the second protective film. This reduces oxidation of the first protective film. As a result, peeling of the multilayer protective film can be reduced, and the nitride semiconductor light-emitting element can be provided with high output and long life.

In the exemplary embodiment of the present disclosure, the multilayer protective film may include a third protective film covering the second protective film, and the third protective film may be amorphous aluminum oxide or amorphous aluminum oxynitride.

This configuration allows reduction in thickness of the crystalline aluminum oxide film as the second protective film, and can prevent reduction in stress of the second protective film, and crack of the second protective film. Thus, the nitride semiconductor light-emitting element can be provided with high output and long life.

In this case, the third protective film may be amorphous aluminum oxide, and the multilayer protective film may include a fourth protective film covering the third protective film, and the fourth protective film may be aluminum oxynitride.

Still in this case, a composition ratio of nitrogen in the aluminum oxynitride may be 23 atom % or lower.

In this configuration, the aluminum oxynitride does not show great variations in refractive index by oxidation, and has higher crystallization temperature than aluminum oxide. Thus, diffusion of oxygen from outside of the protective film can be prevented, and the deterioration of the inside of the protective film can be reduced. This can provide the nitride semiconductor light-emitting element with high output and long life.

In the exemplary embodiment of the present disclosure, an outermost layer of the multilayer protective film may be a stacked film including the first protective film and the second protective film.

In this configuration, crystalline aluminum oxide as the outermost layer prevents permeation of oxygen, thereby preventing entrance of oxygen in the protective film. This can provide the nitride semiconductor light-emitting element with high output and long life.

In the exemplary embodiment of the present disclosure, the first protective film may directly cover the light-emitting facet.

The nitride semiconductor light-emitting element of the present disclosure can provide a strong protective film on the facet which can reduce oxidation of the protective film, and does not cause the optical breakdown even in a high output operation. Thus, the nitride semiconductor light-emitting element can be provided with long life and high reliability.

BRIEF DESCRIPTION OF THE DRAWINGS

FIG. 1A is a schematic cross-sectional view of the nitride semiconductor light-emitting element before a ridge waveguide is formed. FIG. 1B is a schematic cross-sectional view taken along a direction perpendicular to a longitudinal direction of a cavity after the ridge waveguide is formed.

FIG. 5A is an image obtained by transmission electron microscopy, and FIG. 5B and FIG. 5C are transmission electron diffraction patterns.

DETAILED DESCRIPTION

First Embodiment

A first embodiment will be described with reference to the drawings.

As an example of a nitride semiconductor light-emitting element of the first embodiment, a gallium nitride (GaN)-based blue-violet semiconductor laser element and a method for manufacturing the same will be described below.

Figure 1A:
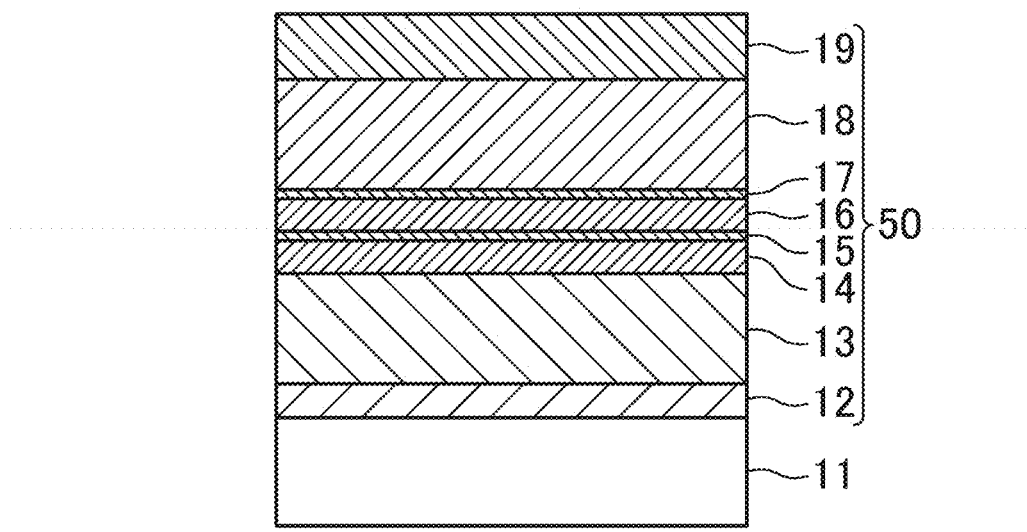
FIGS. 1A and 1B show a nitride semiconductor light-emitting element of a first embodiment.

As shown in FIG. 1A, a layered semiconductor body 50 including a plurality of group III nitride semiconductor layers is epitaxially grown on an n-type substrate 11 made of n-type GaN by, for example, metal-organic chemical vapor deposition (MOCVD).

Specifically, an n-type GaN layer 12 which is about 1 µm in thickness, and contains silicon (Si) as n-type dopants in a concentration of $1 \times 10^{18}$ cm$^{-3}$ is grown on a principal surface of the n-type substrate 11 which is a c-plane (i.e., a (0001) plane) of a plane orientation. Subsequently, an n-type cladding layer 13 which is about 1.5 µm in thickness, and is made of n-type Al$_{0.05}$Ga$_{0.95}$N containing Si in a concentration of $5 \times 10^{17}$ cm$^{-3}$ is grown on the n-type GaN layer 12. An n-type optical guide layer 14 which is about 0.1 µm in thickness, and is made of n-type GaN containing Si in a concentration of $5 \times 10^{17}$ cm$^{-3}$ is grown on the n-type cladding layer 13. A multiple quantum well active layer 15 made of InGaN is grown on the n-type optical guide layer 14. A p-type optical guide layer 16 which is about 0.1 µm in thickness, and is made of p-type GaN containing magnesium (Mg) as p-type dopants in a concentration of $1 \times 10^{19}$ cm$^3$ is grown on the multiple quantum well active layer 15. A p-type electron blocking layer 17 which is about 10 nm in thickness, and is made of p-type Al$_{0.2}$Ga$_{0.8}$N containing Mg in a concentration of $1 \times 10^{19}$ cm$^3$ is grown on the p-type optical guide layer 16. A p-type superlattice cladding layer 18 made of p-type AlGaN is grown on the p-type electron blocking layer 17. Then, a p-type contact layer 19 which is about 20 nm in thickness, and is made of p-type GaN containing Mg in a concentration of $1 \times 10^{20}$ cm$^{-3}$ is grown the on p-type superlattice cladding layer 18.

The multiple quantum well active layer 15 has a double quantum well structure including a well layer which is about 7 nm in thickness, and is made of undoped InGaN, and a 20 nm thick bather layer made of undoped In$_{0.02}$Ga$_{0.98}$N. A composition of In in the well layer is adjusted so that an oscillation wavelength is 405 nm. The p-type superlattice cladding layer 18 has a superlattice structure including a p-type Al$_{0.1}$Ga$_{0.9}$N layer and a p-type GaN layer each containing Mg in a concentration of $1 \times 10^{19}$ cm$^{-3}$, and having a thickness of about 2 nm. The superlattice structure has a total thickness of 0.5 µm.

Figure 1B:
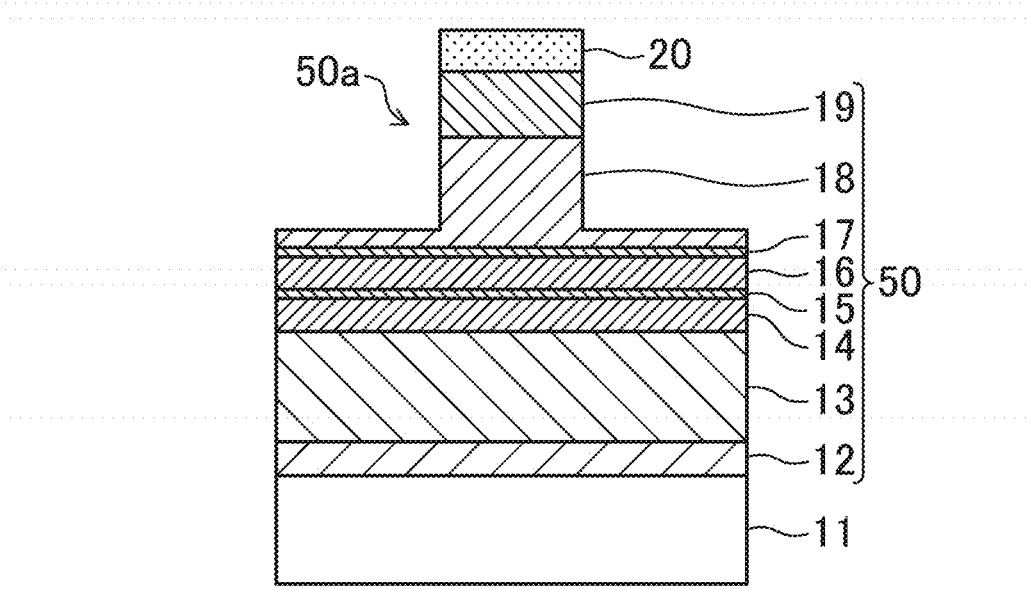

Then, as shown in FIG. 1B, a mask layer 20 made of silicon oxide (SiO$_2$) is formed on the p-type contact layer 19. Then, the mask layer 20 is patterned by lithography and etching into a stripe extending in a <1-100> direction relative to a crystallographic axis of the n-type substrate 11. Using the stripe of the mask layer 20, the p-type contact layer 19 and the p-type superlattice cladding layer 18 are dry-etched to form a ridge waveguide 50a in the shape of a stripe extending in the <1-100> direction relative to the crystallographic axis. The p-type superlattice cladding layer 18 remaining on the sides of the ridge waveguide 50a has a thickness of about 0.1 µm (a remaining thickness). A lower part of the ridge waveguide 50a has a width of about 10 µm, and an upper part of the ridge waveguide 50a has a width of about 8 µm.

Figure 2:
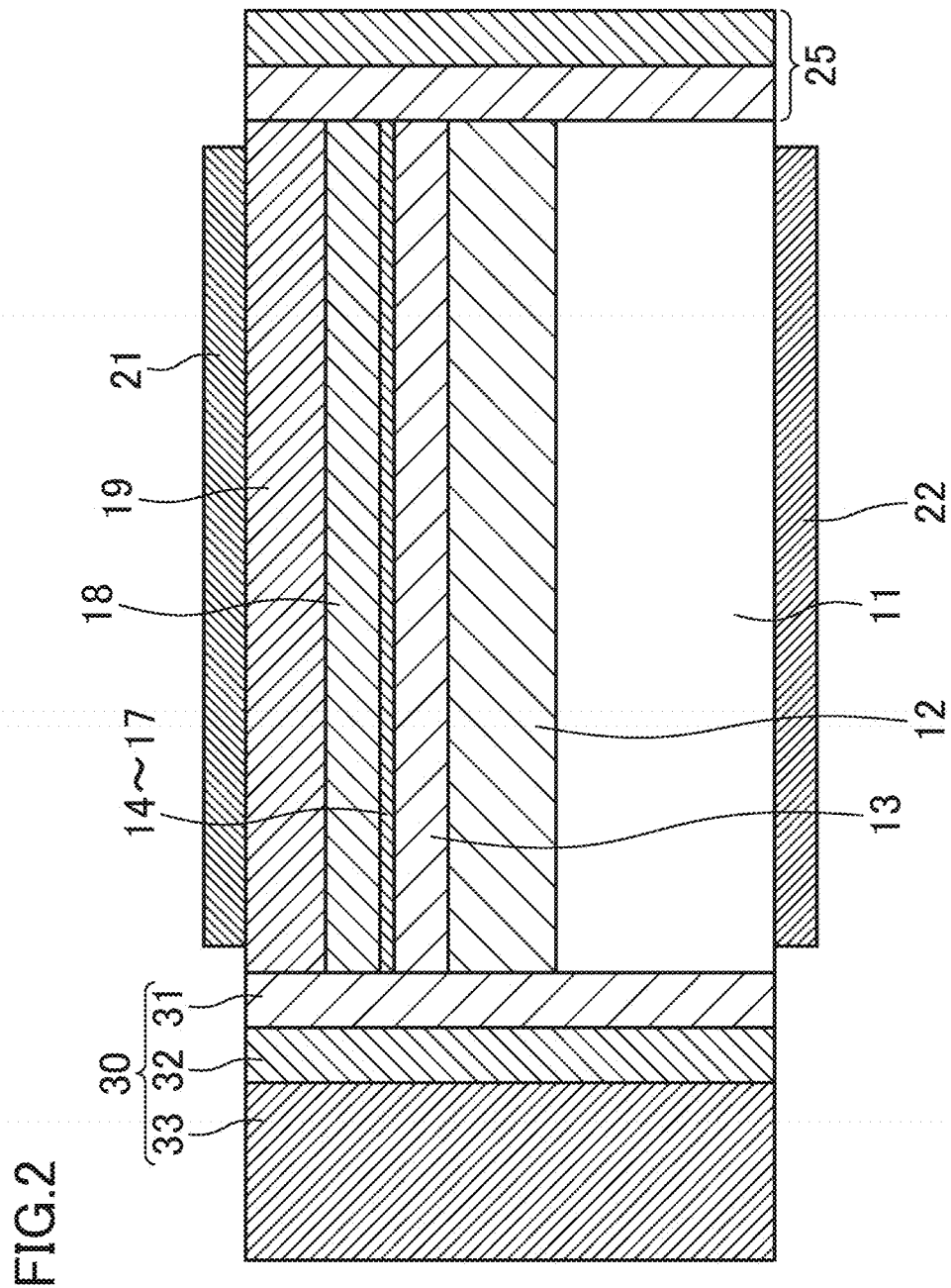
FIG. 2 is a schematic cross-sectional view of the nitride semiconductor light-emitting element of the first embodiment taken along a direction parallel to the longitudinal direction of the cavity.

Then, as shown in FIG. 2, the mask layer 20 is removed, and a p-side electrode 21 made of palladium (Pd) is formed on the p-type contact layer 19 constituting the ridge waveguide 50a by lithography and vacuum deposition, etc. Then, the n-type substrate 11 is thinned down (polished from a rear surface) so that the substrate can easily be cleaved. An n-side electrode 22 made of titanium (Ti) is then formed on a rear surface of the n-type substrate 11.

Then, the n-type substrate 11 and the layered semiconductor body 50 are cleaved so that a cavity formed below the ridge waveguide 50a of the layered semiconductor body 50 has a length of about 800 µm or about 1000 µm. The cleavage provides the layered semiconductor body 50 with two facet mirrors opposing each other, i.e., a front facet (a light-emitting facet) and a rear facet (a reflective facet) which are m-planes (i.e., (1-100) planes). In this specification, symbol "-" added to an index of the crystallographic axis and the plane orientation represents inversion of a given index following the symbol for convenience. Then, multilayer protective films 25 and 30 which are insulating multilayer films are formed on the facets of the cavity, respectively, to cover the facets. The multilayer protective films 25 and 30 are provided to prevent deterioration of the facets of the layered semiconductor body 50, and to adjust reflectances of the facets.

Specifically, as shown in FIG. 2, a coating film made of crystalline aluminum nitride (AlN) is formed on the front facet from which laser light is emitted (the light-emitting facet) as a first protective film 31 directly covering the front facet. Then, a coating film made of crystalline aluminum oxide (Al$_2$O$_3$) is formed as a second protective film 32 covering the first protective film 31. In the present disclosure, a crystalline film designates a film in a monocrystalline state, a polycrystalline state, or a partially crystallized state. A coating film made of amorphous aluminum oxide is then formed as a third protective film 33 covering the second protective film 32. In the present disclosure, an amorphous film is a film which is not crystallized at any part. Compositions of AlN and Al$_2$O$_3$ are not strictly limited to those described above, and a rare earth element such as yttrium (Y), lanthanum (La), etc., may be added thereto. For example, the first protective film 31 may be made of YAlN, LaAlN, etc., and the second protective film 32 may be made of YAlO, LaAlO, etc. The first and second protective films may contain any element as long as they are nitride containing aluminum (Al), and oxide containing aluminum, respectively.

The multilayer protective film 25 formed on the rear facet opposing the front facet includes a stack of multiple pairs of aluminum oxide (Al$_2$O$_3$)/zirconium oxide (ZrO$_2$). The stack of multiple pairs of Al$_2$O$_3$/ZrO$_2$ may be replaced with a stack of multiple pairs of AlON/SiO$_2$, Al$_2$O$_3$/SiO$_2$, or AlN/Al$_2$O$_3$ as long as the rear facet shows a desired reflectance. A first protective film in contact with the rear facet may be an AlN film like the first protective film on the front facet. The AlN film is strong and has high thermal conductivity, and is suitable as the protective film on the rear facet, even if the rear facet does not emit light. In the present embodiment, for example, the front facet has a reflectance of about 6%, and the rear facet has a reflectance of about 95%. The thickness of each of the protective films on the front and rear facets is suitably determined to obtain desired reflectance.

In the first embodiment, the first protective film 31 made of crystalline AlN and the second protective film 32 made of crystalline Al$_2$O$_3$ are formed by electronic cyclotron resonance (ECR) sputtering. The ECR sputtering may be replaced with radio frequency (RF) sputtering, or magnetron sputtering.

FIGS. 3A-3D show a method for manufacturing the protective films on the facet by ECR sputtering.

Figure 3A:
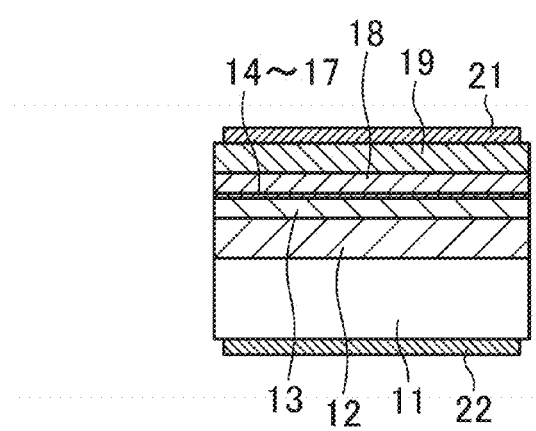
FIGS. 3A-3D are schematic cross-sectional views illustrating steps of a method of manufacturing a protective film on an facet of the nitride semiconductor light-emitting element of the first embodiment.

As shown in FIG. 3A, a plurality of laser bars are obtained by cleaving a wafer (not shown) including a plurality of semiconductor laser elements on chip regions in a direction intersecting with the direction of extension of the ridge waveguides extending parallel to each other.

Figure 3C:
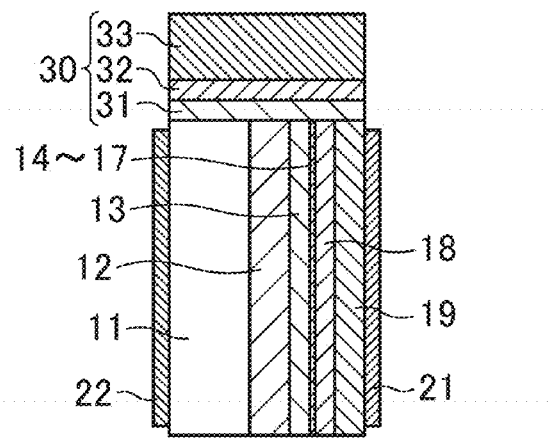
Figure 3B:
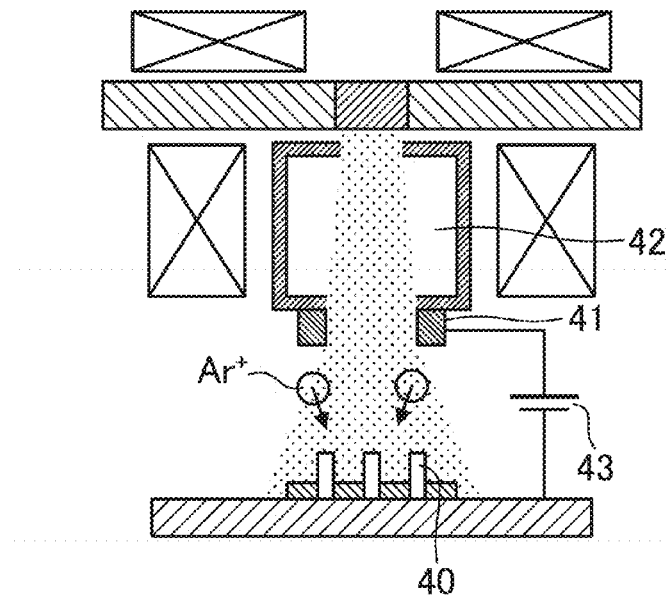
Figure 3D:
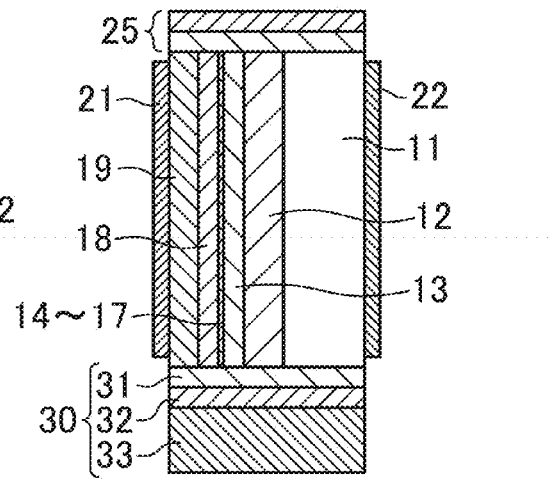

Then, as shown in FIG. 3B, a multilayer protective film 30 including a plurality of dielectric layers is formed on a front (light-emitting) facet of each of the laser bars 40 in an ECR sputtering device. For the protection of the front facet, the front facet is preferably coated first with the protective film before coating the rear facet. After the multilayer protective film 30 is formed as shown in FIG. 3C, a multilayer protective film 25 is formed on the rear facet which is opposite the front facet as shown in FIG. 3D in the ECR sputtering device.

In the ECR sputtering shown in FIG. 3B, in general, the cleaved facet of the laser bar 40 is not directly irradiated with ions (Ar$^+$ ions), and a density of crystal defect of a surface of the semiconductor caused by ion irradiation can be reduced. Therefore, the ECR sputtering is suitable as a method for forming the coatings on the facets of the semiconductor laser element. The AlN film as the first protective film 31 can be formed by reactive sputtering using a combination of a target material 41 and reactive gas, e.g., an AlN target material and nitrogen ($N_2$) gas, or an Al target material and nitrogen gas. In the present embodiment, purity can easily be increased by metal refining. Al as the metal target material is combined with argon (Ar) as reference gas and nitrogen gas as the reaction gas. Since Al is used as the metal target material, an $Al_2O_3$ film can subsequently be formed after the AlN film is formed by merely substituting nitrogen as the reaction gas to oxygen without changing the target material.

The thickness of the first protective film 31 is set to about 6 nm. The AlN film is a crystalline film having high film stress as described above, and the AlN film may be peeled when the AlN film is formed on the cleaved facet of the laser bar 40 in a thickness of 50 nm or larger. To reduce generation of heat associated with absorption of light, an optical path length of light in the first protective film 31 is preferably shortened. Thus, the thickness of the first protective film 31 may be 50 nm or smaller. When the AlN film is thinner than 5 nm, oxygen easily permeates the AlN film, and the facet of the laser bar 40 is oxidized. Further, processing such a thin film cannot easily be controlled, and the thickness of the obtained film may vary. Thus, the thickness of the first protective film 31 may be 5 nm or larger. For these reasons, the thickness of the first protective film 31 made of AlN may be 5 nm to 50 nm, both inclusive. In forming the first protective film 31, the argon (Ar) gas is introduced at a flow rate of 30 ml/min at room temperature, and the nitrogen ($N_2$) gas is introduced at a flow rate of 5.2 ml/min at room temperature.

In the present embodiment, $Al_2O_3$ constituting the second protective film 32 has crystallinity. A method for manufacturing a crystalline $Al_2O_3$ film will be described below.

In general, amorphous $Al_2O_3$ is easily formed by ECR sputtering using Al as a metal target material, and Ar as the reference gas and oxygen as the reactive gas in combination. A crystallization temperature of $Al_2O_3$ is as high as 850° C. or higher. Therefore, to obtain crystalline $Al_2O_3$, a film sample needs to be heated, or corresponding energy needs to be applied to the sample. It has been known that sputtering at high temperature performed in fabrication of a laser device thermally damages electrodes etc., and deteriorates physical properties of the laser device. In the present embodiment, the crystalline $Al_2O_3$ film is formed by increasing energy applied by the ion irradiation to minimize heat applied to the laser bar 40 in the ECR sputtering.

In the ion irradiation, $Ar^+$ ions as a plasma source are used as an ion seed. In a plasma producing chamber 42 shown in FIG. 3B, microwave irradiation in a high magnetic field separates Ar gas molecules into $Ar^+$ ions and electrons, thereby producing a plasma state. Among the ions and the electrons showing cyclotron motion, the electrons have smaller mass, and flow earlier to a film formation region out of the plasma producing chamber 42. Thus, a concentration of the $Ar^+$ ions is relatively higher than a concentration of the electrons in the plasma producing chamber 42. As a result, a potential gradient is provided between the plasma producing chamber 42 and the film formation region. This is called self bias. The laser bars 40 on each of which the film is being formed are irradiated with the accelerated $Ar^+$ ions. Energy of the ion irradiation can generally be increased by two methods. One is increasing kinetic energy of the ions, i.e., increasing a value of the self bias. The other is increasing the density of an ion current, i.e., the pressure of the Ar gas in the plasma producing chamber 42 is increased to increase the density of the ion current, thereby increasing a total amount of energy applied in the film formation. When the pressure is increased too much, the probability of recoupling of the electrons and the $Ar^+$ ions increases, and the self bias is reduced. Further, the accelerated $Ar^+$ ions lose energy by molecular collision before reaching the laser bars 40, and the kinetic energy further decreases. On the other hand, when the pressure is reduced, the self bias increases to increase the kinetic energy per unit ion of the $Ar^+$ ions, but the ion density decreases. That is, the kinetic energy and the ion density are contradictory. In the present embodiment, as shown in FIG. 3B, a voltage supply 43 is connected between the metal target material and each of the laser bars 40, and a predetermined voltage is applied to the metal target material and the laser bars 40. Thus, the ions are accelerated by both of the self bias and the applied voltage, and the energy of the ion irradiation can be increased. In the present embodiment, a voltage of 50V is additionally applied to a voltage of about 10V-50V usually applied by the self bias. However, when the applied voltage is 100V or higher, the acceleration energy of the $Ar^+$ ions increases, the laser bars 40 are damaged, and laser properties are deteriorated. Thus, the voltage applied to the laser bars 40 is preferably 100V or lower. In the present embodiment, the laser bars 40 are not heated, i.e., the film is formed in an unheated condition. However, the film may suitably be formed in a heated condition because crystallization of $Al_2O_3$ is accelerated by heating the laser bars 40. In this case, the film formation needs to be performed in a temperature range in which the laser device is not thermally deteriorated. In view of prevention of oxidation of the electrodes, a heating temperature may be 400° C. or lower.

Figure 4:
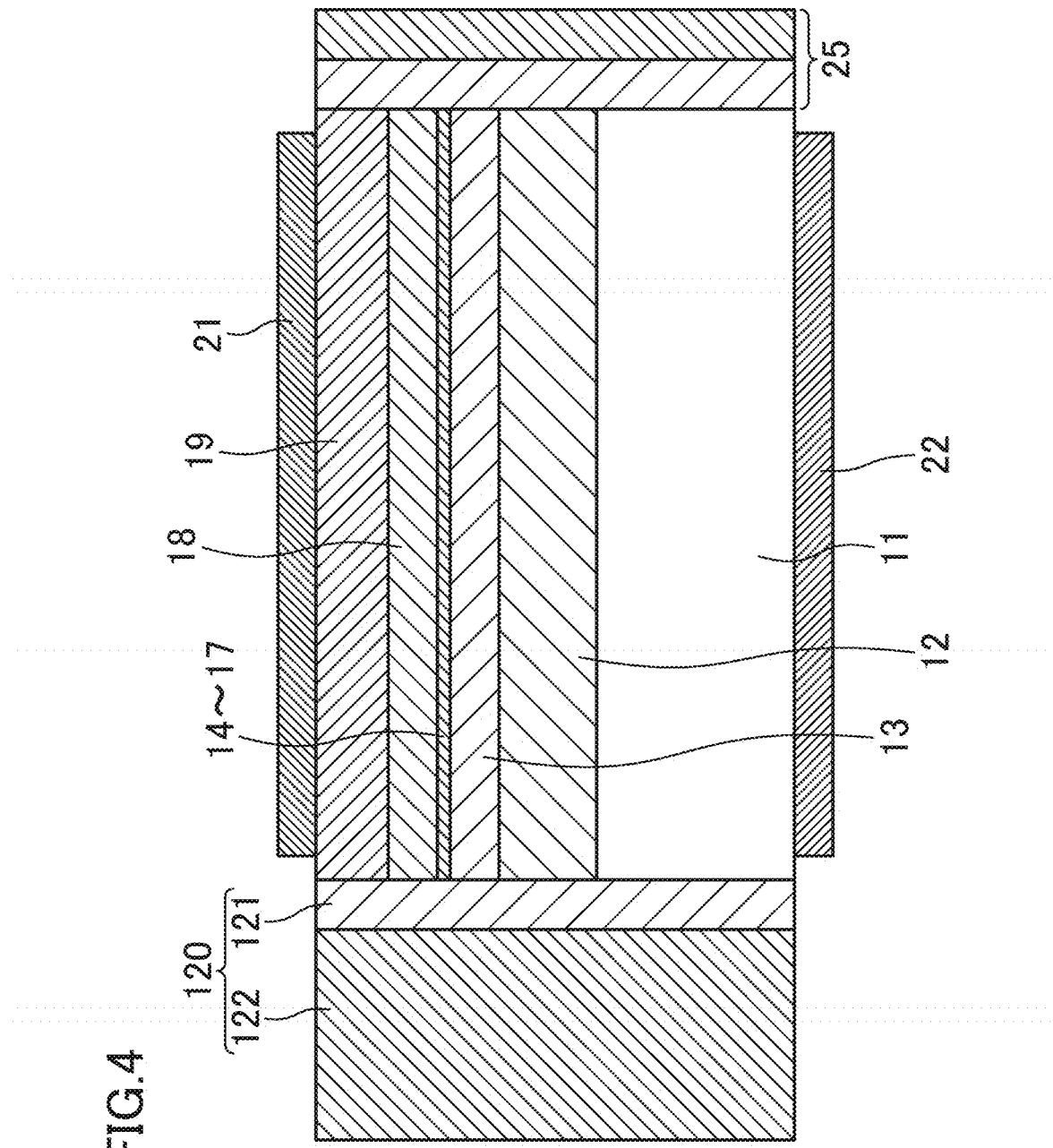
FIG. 4 is a schematic cross-sectional view illustrating a nitride semiconductor light-emitting element of an alternative of the first embodiment.

In forming the second protective film 32 of the first embodiment made of crystalline $Al_2O_3$, the argon (Ar) gas is introduced at a flow rate of 30 ml/min at room temperature, and the oxygen ($O_2$) gas is introduced at a flow rate of 1.0 ml/min at room temperature. A high quality crystalline $Al_2O_3$ film can be formed on the crystalline AlN film. This is called a substrate effect, in which the substrate reduces the crystallization temperature or activation energy of the crystallization in a thermodynamic sense. The formation of the $Al_2O_3$ film on the crystalline AlN film proceeds in a certain cycle and orientation under the influence of the AlN film as an underlayer. Thus, when the film below the $Al_2O_3$ film is amorphous, the crystalline $Al_2O_3$ film cannot be obtained even if a self bias potential is increased. Further, the crystalline $Al_2O_3$ film is crystallized by the substrate effect of AlN, and grows in an amorphous state when the $Al_2O_3$ film is thickened. Under the conditions of the present embodiment, the maximum thickness of the crystalline $Al_2O_3$ film at room temperature is 30 nm Thus, in the present embodiment, the thickness of the crystalline $Al_2O_3$ film is set to 30 nm. However, the maximum thickness of the crystalline $Al_2O_3$ film can be increased to about 50 nm when the $Al_2O_3$ film is formed in a heated condition. Thus, like an alternative of the present embodiment shown in FIG. 4, a multilayer protective film 120 on the front facet may not include an amorphous $Al_2O_3$ film in an outermost layer. That is, the outermost layer of the multilayer protective film 120 may be a double coat structure including a first protective film 121 and a second protective film 122. In this case, a crystalline AlN film is formed as the first protective film 121, and a crystalline $Al_2O_3$ film is formed as the second protective film 122. At this time, the substrate is heated to 400° C. to accelerate crystallization of $Al_2O_3$, thereby increasing the maximum thickness.

The double coat structure including the crystalline AlN film and the crystalline $Al_2O_3$ film of the alternative limits the total thickness of the multilayer protective film 120. Thus, the multilayer protective film 120 cannot show optional reflectance at the facet. When an amorphous $Al_2O_3$ film is formed as a third protective film covering the crystalline $Al_2O_3$ film as shown in FIG. 2 to control the thickness of the $Al_2O_3$ film of a low refractive index, the optional reflectance can be obtained. Different from the conditions of the formation of the crystalline $Al_2O_3$ film, the amorphous $Al_2O_3$ film is formed with a voltage of 0V applied to the metal target material and the laser bars 40. Thus, energy sufficient for the crystallization of the $Al_2O_3$ film is not applied, and the amorphous $Al_2O_3$ film can be formed.

Figure 5A:
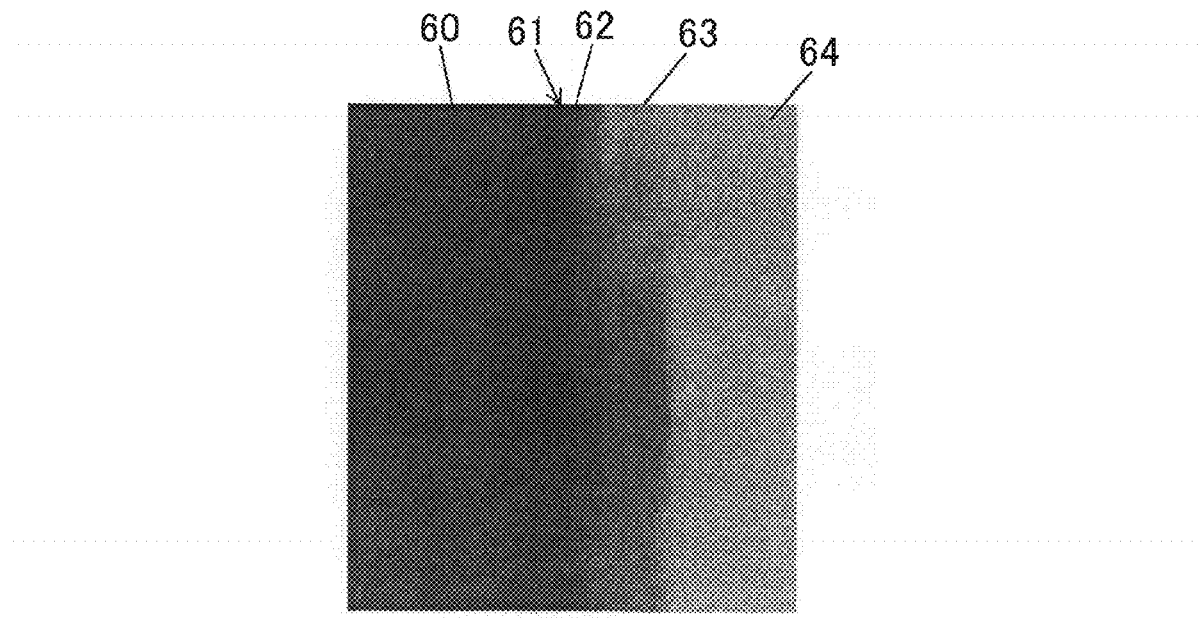
FIGS. 5A-5C show images of the protective film on the facet of the nitride semiconductor light-emitting element of the first embodiment.

FIG. 5A shows an image obtained by transmission electron microscopy of a layered semiconductor body 60 made of a group III nitride semiconductor. A crystalline AlN film 62 is formed as a first protective film on a light-emitting facet 61 which is an m-plane, and a 30 nm thick crystalline $Al_2O_3$ film 63 as a second protective film, and a 60 nm thick amorphous $Al_2O_3$ film 64 as a third protective film are formed in the above-described method. The transmission electron microscopic image of FIG. 5A shows that the crystalline $Al_2O_3$ film 63 is polycrystallized.

Figure 5B:
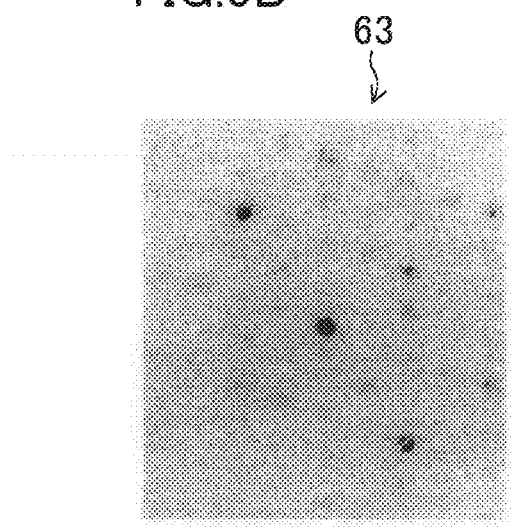
Figure 5C:
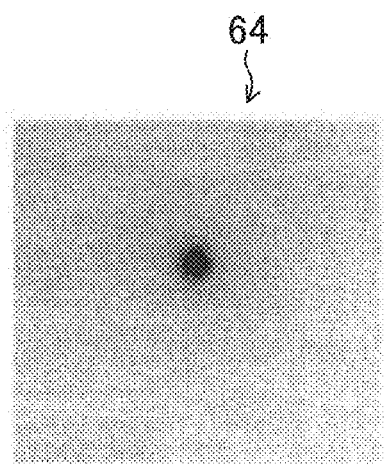

FIGS. 5B and 5C show transmission electron diffraction patterns of the crystalline $Al_2O_3$ film 63 and the amorphous $Al_2O_3$ film 64. As seen in the electron diffraction pattern of FIG. 5B showing diffraction lines, it is determined that the crystalline $Al_2O_3$ film 63 is polycrystallized. On the other hand, the amorphous $Al_2O_3$ film 64 does not show a polycrystalline atomic image in the transmission electron microscopic image, and does not show the diffraction pattern in the electron diffraction pattern of FIG. 5C. Thus, the $Al_2O_3$ film 64 is identified as an amorphous film.

In the present embodiment, $Al_2O_3$ is used as an amorphous layer of low refractive index corresponding to the third protective film. However, in view of control of the reflectance of the light-emitting facet, $SiO_2$ may be used to control the refractive index. To form a $SiO_2$ film on the crystalline $Al_2O_3$ film, the target material needs to be changed. Thus, the $Al_2O_3$ film is preferable in view of shortened manufacturing time.

Figure 6:
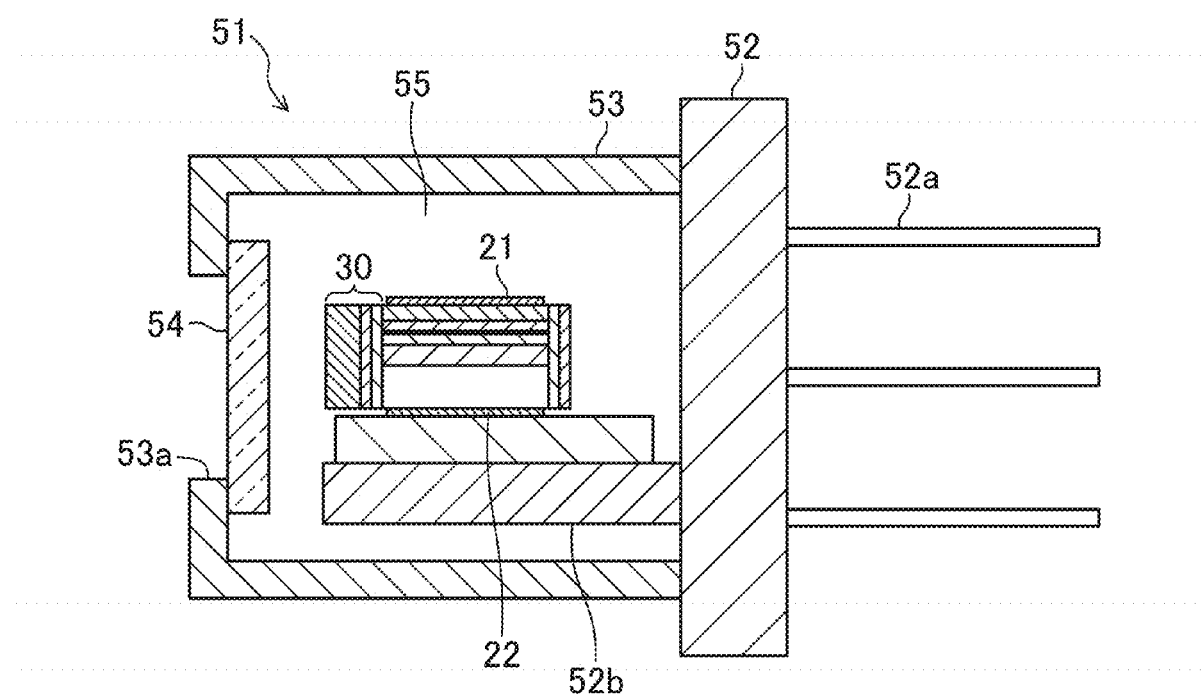
FIG. 6 is a cross-sectional view illustrating a semiconductor laser device packaged with the nitride semiconductor light-emitting element of the first embodiment.

FIG. 6 shows a semiconductor laser device 51 packaged after a plurality of protective films constituting the multilayer protective film 30 are formed. As shown in FIG. 6, the semiconductor laser device 51 is fixed to a laser holder 52b formed on a surface of a metal stem 52. A plurality of electrode terminals 52a are formed on the other surface of the stem 52. A metal cap 53 covering a semiconductor laser element and the laser holder 52b, and having a window 53a positioned to face a front facet of the semiconductor laser element is fixed to the stem 52. A glass plate 54 is fixed to the window 53a from inside, and space defined by the stem 52, the cap 53, and the glass plate 54 is hermetically sealed. Sealed space inside the cap 53 is filled with gas 55 which is dry air free from moisture, or inert gas such as argon.

Figure 7A:
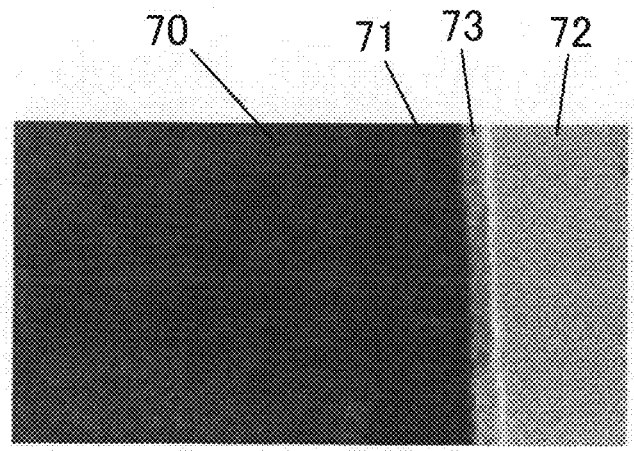
FIG. 7A is an image of a protective film on a facet of a conventional nitride semiconductor light-emitting element obtained by transmission electron microscopy after an accelerated test is performed.
Figure 7B:
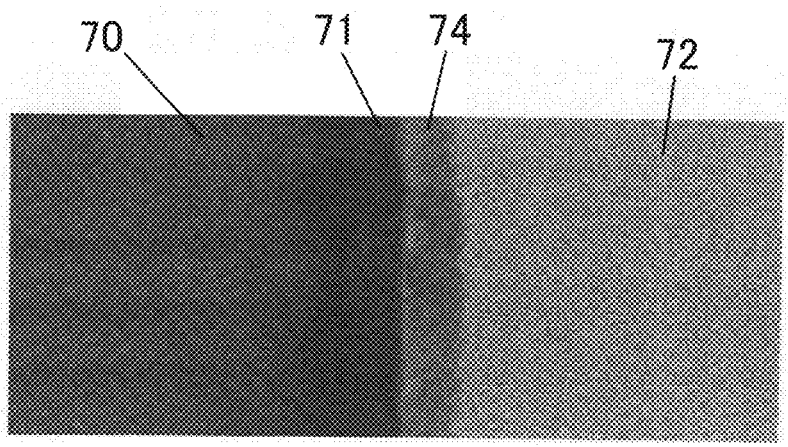
FIG. 7B is an image of the protective film on the facet of the nitride semiconductor light-emitting element of the first embodiment obtained by transmission electron microscopy after the accelerated test is performed.

FIGS. 7A and 7B show images obtained by transmission electron microscopy of protective films which are formed on a light-emitting facet of a layered semiconductor body 70 made of a group III nitride semiconductor, and experienced an accelerated test in the presence/absence of the crystalline $Al_2O_3$ film. FIG. 7A shows a state of a facet of a conventional laser element without the crystalline $Al_2O_3$ film after the accelerated test by energization. The protective film is a double coat film, and a first protective film 71 is a 30 nm thick crystalline AlN film. A third protective film 72 formed on the first protective film 71 is an amorphous $Al_2O_3$ film. A white layer 73 present between the first and third protective films 71 and 72 is formed by oscillation of the laser element, and is not present before the energization. The white layer 73 is identified as an aluminum oxynitride layer (AlON layer) by composition analysis by energy dispersive X-ray spectroscopy and electron diffraction. As described above, this is considered as a layer generated as a result of diffusion of oxygen in the protective film by the laser oscillation, and oxidation of the crystalline AlN film as the first protective film 71. The presence of the white layer 73 causes peeling of the protective film and light absorption, thereby causing the sudden death failure.

FIG. 7B shows the configuration of the present embodiment in which a crystalline $Al_2O_3$ film as a second protective film 74 is formed between the first and third protective films 71 and 73. Even after the energization test under the same conditions as the test performed on the conventional sample shown in FIG. 7A, the AlN film as the first protective film 71 is not oxidized. This presumably indicates that the crystalline $Al_2O_3$ film as the second protective film 74 functions as a barrier against the diffusion of oxygen (O), and inhibits permeation of oxygen, thereby reducing the oxidation reaction of the AlN film. Due to this effect, a semiconductor laser element showing high reliability even in a high output operation can be provided.

Second Embodiment

A second embodiment will be described below with reference to the drawings.

Figure 8:
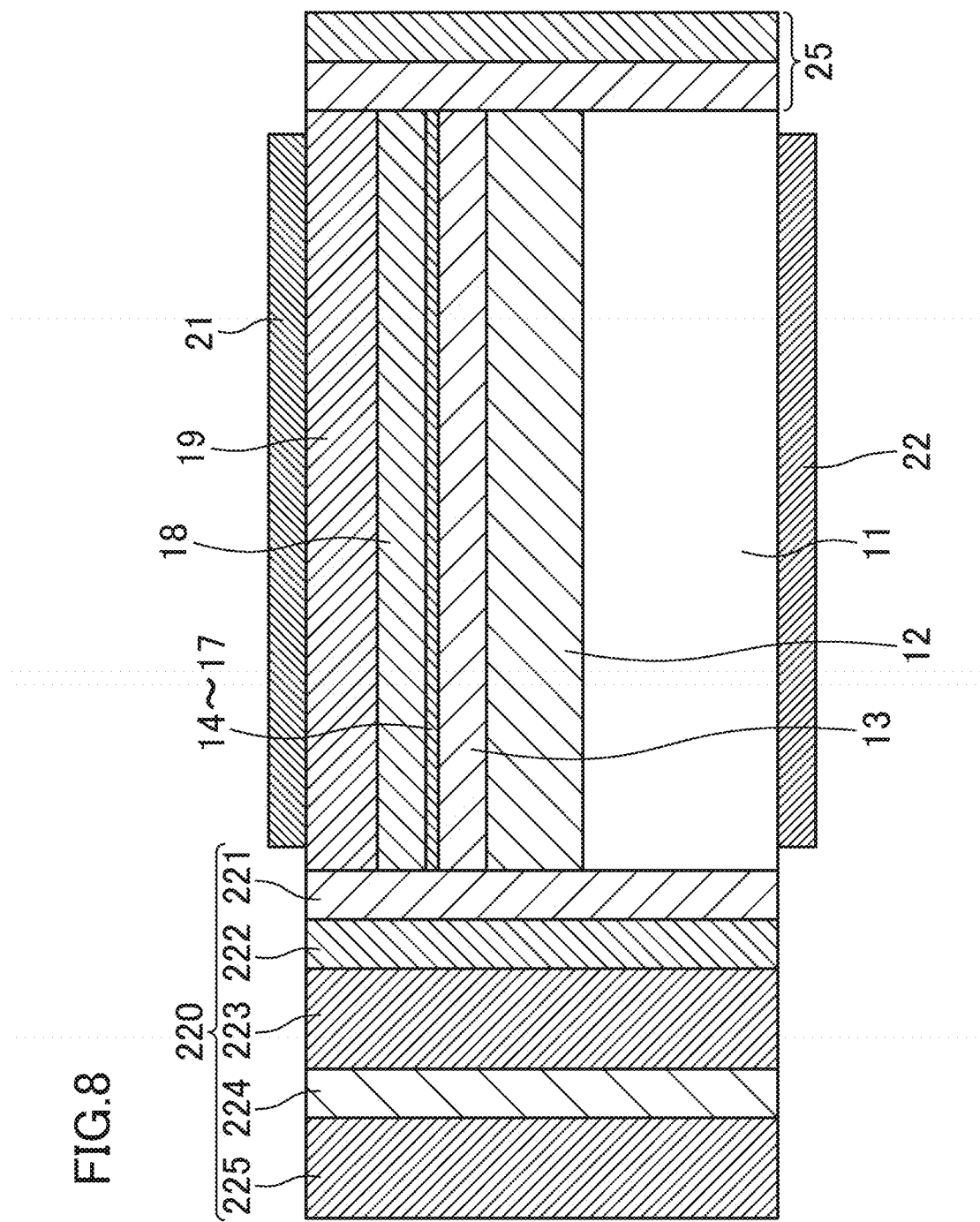
FIG. 8 is a schematic cross-sectional view illustrating a nitride semiconductor light-emitting element of a second embodiment.

FIG. 8 shows a schematic cross-section of a GaN-based blue-violet semiconductor laser element as a nitride semiconductor light-emitting element of a second embodiment.

In FIG. 8, the same reference numerals as those of the first embodiment are given to components of a layered semiconductor body constituting a semiconductor laser element and electrodes 21, 22. In this embodiment, a multilayer protective film 220 formed on a front facet will be described. Like the multilayer protective film of the laser element of the first embodiment, the multilayer protective film 220 includes a crystalline AlN film as a first protective film 221, and a crystalline $Al_2O_3$ film as a second protective film 222 formed on the first protective film 221. Additionally, an amorphous $Al_2O_3$ film or an amorphous $SiO_2$ film is formed as a third protective film 223 on the second protective film 222. Subsequently, an amorphous AlON film is formed as a fourth protective film 224, and an amorphous $Al_2O_3$ film or an amorphous $SiO_2$ film is formed as a fifth protective film 225.

The crystalline $Al_2O_3$ film as the second protective film 222 can be formed in the same manner as the first embodiment. The AlON film as the fourth protective film 224 may directly cover the crystalline $Al_2O_3$ film as the second protective film 222, i.e., the third protective film 223 may be omitted.

In the first embodiment, the crystalline $Al_2O_3$ film as the second protective film prevents permeation of oxygen diffused from outside, and reduces oxidization of the AlN film as the first protective film 221, thereby realizing high reliability. Although the crystalline $Al_2O_3$ film can favorably function as a barrier against oxygen, the barrier is not perfect. Thus, prevention of the diffusion of oxygen to a higher extent is required for the higher output operation of the semiconductor light-emitting element at higher temperature.

In the second embodiment, an aluminum oxynitride (AlON) film is formed as an oxygen trap layer outside the crystalline $Al_2O_3$ film as the second protective film 222 to enhance the barrier function against diffused oxygen. In this case, the AlON film as the fourth protective film 224 is formed so that a composition ratio of nitrogen (N) atoms in the AlON film as the fourth protective film 224 is 23 atom % or lower. An atomic composition of nitrogen is defined by the following formula (I).

Atomic composition of N={number of N atoms/(number of Al atoms+number of N atoms+number of O atoms)}×100     (Formula I)

In forming the AlON film as the fourth protective film 224, a combination of 1) an AlN target material and oxygen ($O_2$) gas, 2) an $Al_2O$ target material and nitrogen ($N_2$) gas, 3) an AlON target material and oxygen ($O_2$) gas, nitrogen ($N_2$) gas or a mixture gas of oxygen ($O_2$) and nitrogen ($N_2$), or 4) an Al target material and a mixture gas of oxygen ($O_2$) and nitrogen ($N_2$) may be used.

In the second embodiment, a mixture gas of $O_2$ and $N_2$ is used as the reactive gas to form the AlON film. To control the speed of film formation, argon (Ar) gas is simultaneously introduced into the ECR chamber. In forming the AlON film in the present embodiment, Ar is introduced at a flow rate of 20 ml/min, $N_2$ is introduced at a flow rate of 5.5 ml/min, and $O_2$ is introduced at a varied flow rate to control the composition ratio of nitrogen in the AlON film. The flow rates of the gases are determined under a normal state (25° C., 1 atmospheric pressure) (the same is applied to the description below). In the second embodiment, the flow rate of $O_2$ is varied in the range of 0 ml/min to 1.0 ml/min in forming the AlON film. The described flow rates are merely examples, and the present disclosure is not limited thereto.

Figure 9:
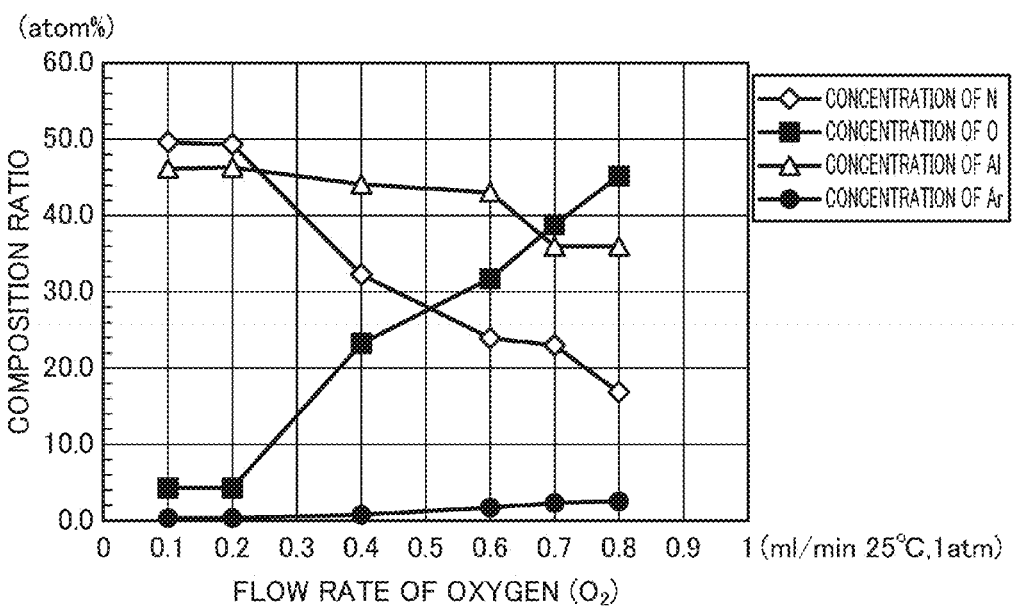
FIG. 9 is a graph showing a relationship between a flow rate of oxygen in forming an AlON film constituting a protective film on a facet of the nitride semiconductor light-emitting element of the second embodiment and an atomic composition in the AlON film.

FIG. 9 shows a relationship between the flow rate of $O_2$ in forming the AlON film and compositions of elements in the AlON film. At this time, the flow rate of the Ar gas is 20 ml/min, and the flow rate of the $N_2$ gas is 5.5 ml/min FIG. 9 indicates that the composition of N decreases, and the composition of O increases with the increase in flow rate of the $O_2$ gas. Since Ar is used as atmospheric gas in the sputtering chamber, a trace amount of Ar is detected in the AlON film. Physical properties of the AlON film vary as the compositions vary.

Figure 10:
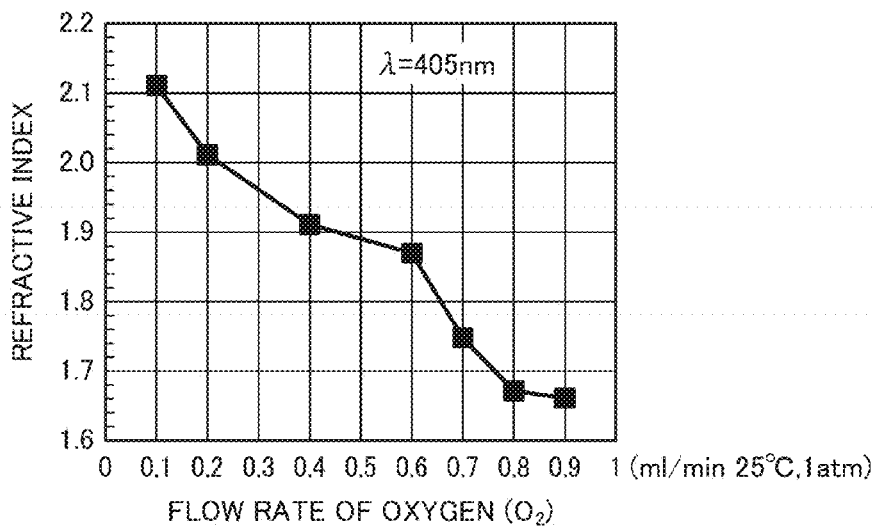
FIG. 10 is a graph showing a relationship between the flow rate of oxygen in forming the AlON film constituting the protective film on the facet of the nitride semiconductor light-emitting element of the second embodiment and a refractive index of the AlON film.

FIG. 10 shows a relationship between a refractive index of the AlON film relative to light having a wavelength λ of 405 nm and the flow rate of $O_2$. An AlN film free from oxygen has a refractive index of about 2.1, and an $Al_2O_3$ film free from nitrogen has a refractive index of 1.65. FIG. 10 indicates that the refractive index of the AlON film gradually decreases with the increase in flow rate of $O_2$ from the refractive index closer to that of AlN to the refractive index closer to that of $Al_2O_3$.

Figure 11:
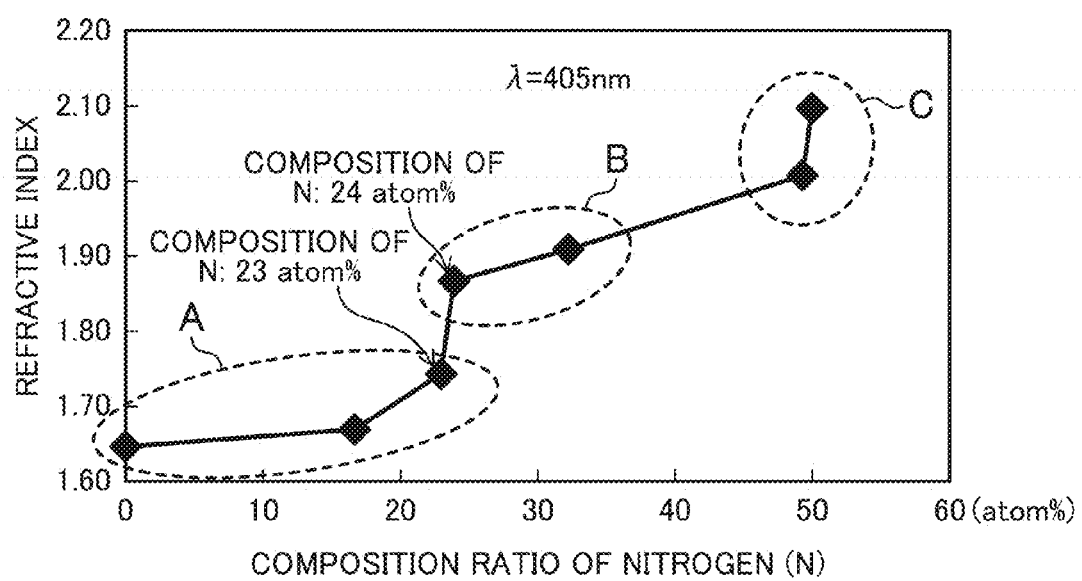
FIG. 11 is a graph showing relationship between a composition ratio of N atoms in the AlON film constituting the protective film on the facet of the nitride semiconductor light-emitting element of the second embodiment and the refractive index of the AlON film.

FIG. 11 shows a relationship between the atomic composition of N in the AlON film formed in the second embodiment and the refractive index of the AlON film relative to light having a wavelength 2, of 405 nm. In the graph of FIG. 11, a horizontal axis represents the atomic composition of the nitrogen atoms contained in the AlON film by atom %, and a vertical axis represents the refractive index of the AlON film. When the atomic composition of N is 0 atom %, the film is $Al_2O_3$. When the atomic composition of N is 50 atom %, the film is AlN. As shown in FIG. 11, the graph is divided into three groups of different refractive indices relative to the atomic composition of N. Specifically, a group in which the atomic composition of N is 0-23 atom % is called group A, a group in which the atomic composition of N is 24-40 atom % is called group B, and a group in which the atomic composition of N is 40 atom % or higher is called group C. The inventors of the present disclosure have found that the refractive index greatly varies from 1.75 to 1.87 as the atomic composition of N varies by 1 atom %, i.e., from 23 atom % to 24 atom %. Further, it has been recognized that the group C where the atomic composition of N is 40 atom % shows the refractive index which is almost the same as that of AlN, i.e., around 2.0.

During the laser oscillation of the semiconductor laser element, the composition ratio of N in the AlON film as the fourth protective film 224 shown in FIG. 8 relatively decreases as the film is oxidized. As apparent from FIG. 11, when the atomic composition of N in the AlON film is 23 atom % or lower, the refractive index does not greatly decrease even when the composition ratio of N is varied by the oxidation of AlON. Thus, even if the AlON film is oxidized in the laser oscillation and oxygen is captured, the refractive index of the AlON film does not vary. The AlON film can inhibit the diffusion of oxygen without variation in optical properties of the film, and the semiconductor laser element can be provided with high reliability even in a high output operation. When the atomic composition of N is 24 atom % or higher, the refractive index greatly decreases when the oxidation by the laser oscillation occurs and the atomic composition of N decreases from 24 atom % to 23 atom %. The variation in refractive index means variation in refractive index of the facet, and laser properties vary during the laser oscillation. This may cause variations in operation properties.

At least for the above-described reasons, the atomic composition of N in the AlON film as the fourth protective film 224 is preferably 23 atom % or lower.

Third Embodiment

A third embodiment will be described below with reference to the drawings.

Figure 12:
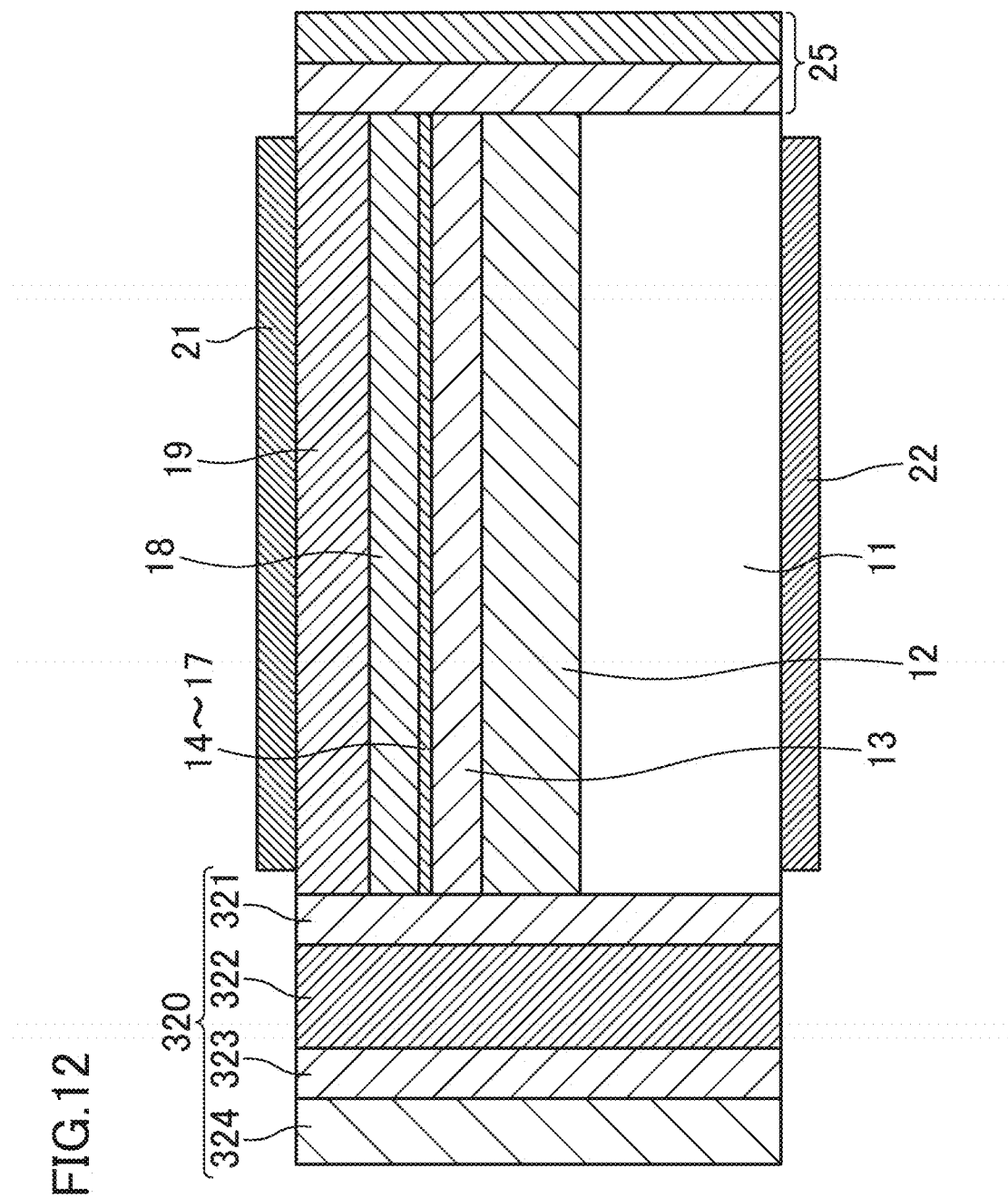
FIG. 12 is a schematic cross-sectional view illustrating a nitride semiconductor light-emitting element of a third embodiment.
Figure 13:
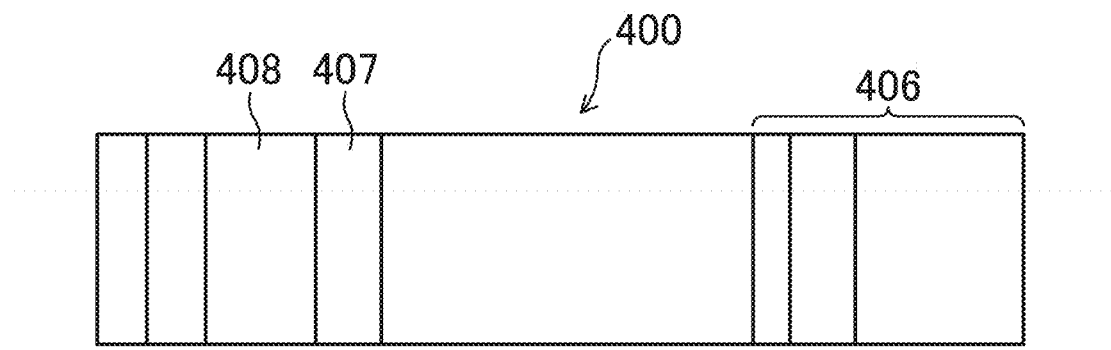
FIG. 13 is a schematic cross-sectional view illustrating a conventional nitride semiconductor light-emitting element.

FIG. 12 shows a schematic cross-section of a violet GaN semiconductor laser element as a nitride semiconductor light-emitting element of the third embodiment.

In FIG. 12, the same reference numerals as those of the first embodiment are given to components of a layered semiconductor body constituting a semiconductor laser element and electrodes 21, 22. In the third embodiment, a multilayer protective film 320 formed on a front facet will be described. The multilayer protective film 320 of the present embodiment is a four-layer structure, and includes a crystalline AlN film as a first protective film 321, and an amorphous $Al_2O_3$ film as a second protective film 322. A crystalline AlN film and a crystalline $Al_2O_3$ film are used as a third protective film 323 and a fourth protective film 324 covering the second protective film 322.

In the first and second embodiments described above, the crystalline $Al_2O_3$ film is used as the second protective film. As described above, a high bias voltage is applied in forming the crystalline $Al_2O_3$ film, and the AlN film as an underlayer of the $Al_2O_3$ film is irradiated with $Ar^+$ ions having high kinetic energy. The AlN film cannot easily be thickened in view of reduction of film stress and light absorption. Thus, the high speed ions permeate the AlN film during the sputtering, and damage the facet of the GaN semiconductor layer, thereby reducing the reliability.

In the present embodiment, as shown in FIG. 12, the crystalline $Al_2O_3$ film is provided as the fourth protective film 324 as an outermost layer of the multilayer protective film 320. With the crystalline $Al_2O_3$ film kept away from the facet of the GaN semiconductor layer, damage caused by the ions to the facet of the GaN semiconductor layer can be reduced.

As described above, the crystalline $Al_2O_3$ film is preferably formed on the crystalline AlN film. Thus, the crystalline AlN film is formed as the third protective film 323 which is the underlayer of the crystalline $Al_2O_3$ film. Specifically, in the present embodiment, a stacked film including the crystalline AlN film and the crystalline Al₂O₃ film is provided as the outermost layer and the second outermost layer of the multilayer protective film 320. The amorphous Al₂O₃ film is used as the second protective film 322 of the present embodiment, but may be replaced with a SiO₂ film or the AlON film described in the second embodiment.

The present embodiment can reduce damage to the facet of the GaN semiconductor layer caused by high energy ions used to form the crystalline Al₂O₃ film, and can provide the crystalline Al₂O₃ film having a high oxygen bather function. Therefore, a GaN semiconductor laser element which shows high reliability even in a high output operation, i.e., a nitride semiconductor light-emitting element, can be provided.

The disclosed nitride semiconductor light-emitting element can provide a protective film which protects a facet of an active layer, and is not deteriorated and does not cause optical breakdown even in laser oscillation. In particular, the present disclosure is useful for nitride semiconductor light-emitting elements having a protective film which protects a facet on which an active layer is exposed.

What is claimed is:

1. A nitride semiconductor light-emitting element, comprising:
   a layered semiconductor body which is made of a group III nitride semiconductor, and includes a light-emitting facet, and
   a multilayer protective film which is formed to cover the light-emitting facet of the layered semiconductor body, wherein
   the multilayer protective film includes a first protective film and a second protective film covering the first protective film,
   the first protective film is made of crystalline nitride containing aluminum, and
   the second protective film is made of crystalline oxide containing aluminum and does not contain nitrogen, and includes a crystallized region which is in direct contact with the first protective film.

2. The nitride semiconductor light-emitting element of claim 1, wherein
   the multilayer protective film includes a third protective film covering the second protective film, and
   the third protective film is amorphous aluminum oxide or amorphous aluminum oxynitride.

3. The nitride semiconductor light-emitting element of claim 2, wherein
   the third protective film is amorphous aluminum oxide,
   the multilayer protective film includes a fourth protective film covering the third protective film, and
   the fourth protective film is aluminum oxynitride.

4. The nitride semiconductor light-emitting element of claim 2, wherein
   the third protective film is amorphous aluminum oxynitride, and
   a composition ratio of nitrogen in the third protective film is 23 atom % or lower.

5. The nitride semiconductor light-emitting element of claim 1, wherein an outermost layer of the multilayer protective film is a stacked film including the first protective film and the second protective film.

6. The nitride semiconductor light-emitting element of claim 1, wherein the first protective film directly covers the light-emitting facet.

7. The nitride semiconductor light-emitting element of claim 2, wherein the second protective film and the third protective film are continuously formed.

8. The nitride semiconductor light-emitting element of claim 1, wherein a thickness of the first protective film is from 5 nm to 50 nm.

9. The nitride semiconductor light-emitting element of claim 1, wherein a thickness of the second protective film is from 30 nm to 50 nm.

10. The nitride semiconductor light-emitting element of claim 1, wherein the multilayer protective film further includes an insulating film.

11. A nitride semiconductor light-emitting element, comprising:
    a layered semiconductor body which is made of a group III nitride semiconductor, and includes a light-emitting facet, and
    a multilayer protective film which is formed to cover the light-emitting facet of the layered semiconductor body, wherein
    the multilayer protective film includes a crystalline AlN film formed on the light-emitting facet, a crystalline Al₂O₃ film formed on the crystalline AlN film, and an amorphous AlON film formed on the crystalline Al₂O₃ film,
    and
    a thickness of the crystalline Al₂O₃ film is from 30 nm to 50 nm.

12. The nitride semiconductor light-emitting element of claim 11, wherein a composition ratio of nitrogen in the amorphous AlON film is 23 atom % or lower.

13. The nitride semiconductor light-emitting element of claim 11, wherein the crystalline AlN film directly covers the light-emitting facet.

14. The nitride semiconductor light-emitting element of claim 11, wherein the crystalline Al₂O₃ film and the amorphous AlON film are continuously formed.

15. The nitride semiconductor light-emitting element of claim 11, wherein a thickness of the crystalline AlN film is from 5 nm to 50 nm.

16. The nitride semiconductor light-emitting element of claim 11, wherein the multilayer protective film further includes an insulating film.

17. A nitride semiconductor light-emitting element, comprising:
    a layered semiconductor body which is made of a group III nitride semiconductor, and includes a light-emitting facet, and
    a multilayer protective film which is formed to cover the light-emitting facet of the layered semiconductor body, wherein
    the multilayer protective film includes a crystalline AlN film formed on the light-emitting facet and a crystalline Al₂O₃ film formed on the crystalline AlN film,
    an outermost layer of the multilayer protective film is the crystalline Al₂O₃ film, and
    a thickness of the crystalline Al₂O₃ film is from 30 nm to 50 nm.

18. The nitride semiconductor light-emitting element of claim 17, wherein the crystalline AlN film directly covers the light-emitting facet.

19. The nitride semiconductor light-emitting element of claim 17, wherein a thickness of the crystalline AlN film is from 5 nm to 50 nm.

\* \* \* \* \*